United States Patent [19]
Eddy

[11] Patent Number: 5,527,766
[45] Date of Patent: Jun. 18, 1996

[54] METHOD FOR EPITAXIAL LIFT-OFF FOR OXIDE FILMS UTILIZING SUPERCONDUCTOR RELEASE LAYERS

[75] Inventor: Michael M. Eddy, Santa Barbara, Calif.

[73] Assignee: Superconductor Technologies, Inc., Santa Barbara, Calif.

[21] Appl. No.: 166,011

[22] Filed: Dec. 13, 1993

[51] Int. Cl.$^6$ .................. B32B 31/24; C04B 35/45
[52] U.S. Cl. .................. 505/410; 156/636.1; 216/40; 216/101; 216/105; 216/106; 427/419.3; 117/915; 117/247
[58] Field of Search .................. 156/631, 667; 505/410, 701; 117/915, 922, 947; 427/62, 419.3; 437/974; 148/DIG. 12, DIG. 135; 216/40, 101, 105, 106

[56] References Cited

U.S. PATENT DOCUMENTS

| | | | |
|---|---|---|---|
| 4,537,818 | 8/1985 | Quinby | 428/262 |
| 4,843,060 | 6/1989 | Lessoff et al. | 427/62 |
| 4,921,335 | 5/1990 | Ditman | 350/354 |
| 4,929,575 | 5/1990 | Khoury et al. | 501/137 |
| 4,956,335 | 9/1990 | Agostinelli et al. | 505/701 |
| 4,988,674 | 1/1991 | Mir et al. | 505/701 |
| 5,132,282 | 6/1992 | Newman et al. | 505/701 |
| 5,173,474 | 12/1992 | Connell et al. | 505/701 |
| 5,270,294 | 12/1993 | Wu et al. | |
| 5,274,249 | 12/1993 | Xi et al. | 427/62 |
| 5,292,717 | 3/1994 | Roas | 427/62 |
| 5,323,023 | 6/1994 | Fork | 505/701 |

FOREIGN PATENT DOCUMENTS

| | | |
|---|---|---|
| 496215A2 | 1/1992 | European Pat. Off. |

OTHER PUBLICATIONS

Howard, R. E., Applied Phys. Lett. 33(12) (1978) 1934 "A Refractory Lift Off Process . . .".

*Primary Examiner*—Tom Thomas
*Assistant Examiner*—Leon Radomsky
*Attorney, Agent, or Firm*—Lyon & Lyon

[57] ABSTRACT

Novel structures and methods utilize layered copper oxide release materials to separate oxide films from growth substrates. Generally, the method comprises the steps of: first, forming a layered copper oxide sacrificial release material on a growth substrate, in the preferred embodiment being the high temperature superconductor YBCO grown on a compatible substrate such as $LaAlO_3$, second, forming an oxide film on the layered copper oxide release material, in the preferred embodiment, a ferroelectric, an optical material or a oxide film compatible with further high temperature superconductor growth, such as $SrTiO_3$ or $CeO_2$, and third, etching the layered copper oxide release material so as to separate the oxide film from the growth substrate. Optionally, additional layers may be grown on the oxide film prior to etching. In the preferred embodiment, when high temperature superconducting devices are formed, the oxide films would be a material such as $SrTiO_3$ or $CeO_2$, upon which yet another high temperature superconducting film would be grown. After patterning and protecting the etched film, the structure may be etched. Generally, any of the layered copper oxide films, such as YBCO, TlCaBaCuO, LaSrCuOx and BiSrCaCuOx can be used. Oxide films having a substantially lower etch rate than the layered copper oxide materials incompatible with growth on the layered copper oxide materials may be utilized.

27 Claims, 2 Drawing Sheets

STEP 1

STEP 2

STEP 3

STEP 4

STEP 5

STEP 6

STEP 7

STEP 8

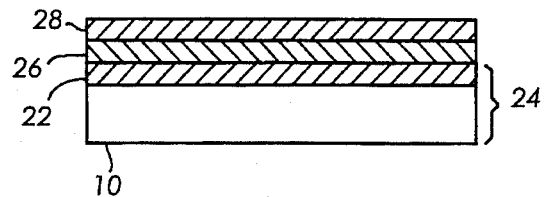
FIG. 2
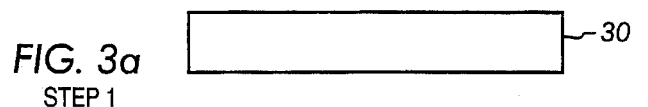
FIG. 3a
STEP 1
FIG. 3b
STEP 2
FIG. 3c
STEP 3
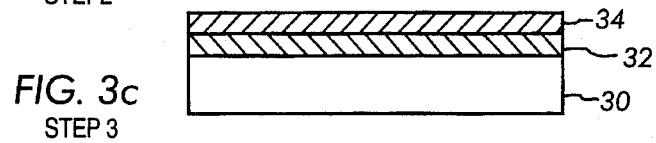
FIG. 3d
STEP 4
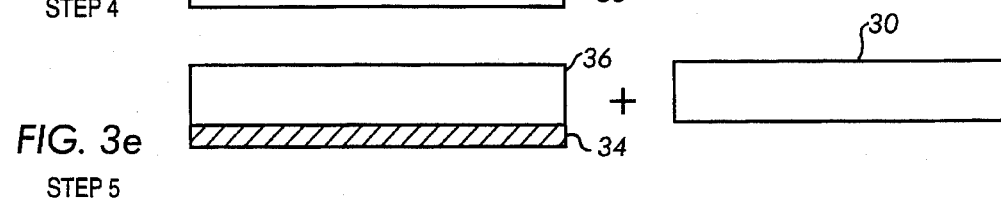
FIG. 3e
STEP 5
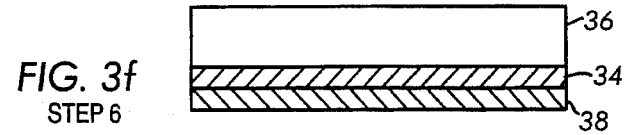
FIG. 3f
STEP 6

METHOD FOR EPITAXIAL LIFT-OFF FOR OXIDE FILMS UTILIZING SUPERCONDUCTOR RELEASE LAYERS

FIELD OF THE INVENTION

This invention relates to the growth of crystalline films, more particularly epitaxial single crystal films. This invention further relates to the growth of oxide films, including films of high temperature superconductors, ferroelectric films and non-linear optic films.

The invention was developed utilizing federal funds from Wright Patterson Airforce Base, Contract No. F33615-93-C-5342.

BACKGROUND OF THE INVENTION

Crystalline structures come in various sizes and forms. Many useful devices are formed as thin crystalline films, typically formed upon a substrate. Examples of such films include thin film high temperature superconductors formed upon substrates, thin magnetic films, such as ferroelectric films formed upon substrates, or optical materials, such as when non-linear optical materials are interfaced with semiconductor devices.

Ordinarily, the decision of what substrate material to use with a crystalline film has been subject to severe restrictions. Generally, the substrate was chosen so as to optimize the growth prospects of the film. Therefore, factor such as minimizing cost or providing good performance properties for the intended use of the ultimate film were not emphasized.

While there are many considerations in choosing the substrate, the following factors are important. They are not necessarily listed in order of importance.

First, the thermal expansion properties of the substrate and the crystal must be compatible. High temperature processing of crystalline films typically require that the substrate have thermal expansion properties similar to that of the crystal, least the crystal "crack" upon cooling of the substrate and crystal.

Second, the substrate must have good thermal stability properties. Crystal processing often occurs at many hundreds °C., often up to 900° C., and therefore, require that the substrate be stable throughout the processing temperature range.

Third, there must be a relatively good match of the crystal lattice structure between the substrate and the film. If the lattice mismatch is too great, the crystal and substrate will not been an epitaxial relationship which is required for the best properties.

Fourth, interdiffusion between the substrate and the film must be considered. If the substrate is such that there is substantial interdiffusion between the substrate and the film, suboptimal films may result.

Fifth, the fragility of the substrates must be considered. One function of the substrate is to provide support to the thin film. If the substrate itself is fragile, the overall structure may have unacceptably high fragility.

Sixth, the various structures of the substrate must be considered. One particularly problematic crystal phenomenon is that of twinning, wherein the crystal changes structure as a function of temperature. Films which are formed at a temperature above the twinning temperature often become unacceptable at a lower temperature, when the substrate is in a non-twinned state.

Seventh, the dielectric constant of the substrate must be considered. Often, substrates which are acceptable for other reasons have an unacceptably high dielectric constant. This is often a concern for microwave compatible devices as the dielectric constant of the substrate strongly impacts the overall dielectric constant of the device.

Finally, the cost of the substrate is often significant. Except with very common materials such as silicon, single crystal substrate materials tend to be very expensive. Alternatively, polycrystalline materials tend to be relatively inexpensive.

Thus, when making a choice of a substrate, the historical emphasis was on compatibility of the substrate with the growth of a quality film. For example, the concerns of thermal expansion, thermal stability, lattice mismatch, interdiffusion and twinning were of concern. The factors such as dielectric constant and cost were of lesser importance. Significantly, however, these factors are critically important to formation of useful devices, and ultimately, market acceptance.

Various high temperature superconducting thin film structures have been known now for some time. Since there discovery in 1986 by Bednorz and Muller, high temperature superconducting materials have been formulated in different forms. While early materials were formed in generally bulk form, useful devices have been fabricated from thin film materials. Olson, et al, "Preparation of Superconducting TlCaBaCu Thin Films By Chemical Deposition", Appl. Phys. Lett. 55, No. 2, 189–190 (1989).

Since the discovery of high temperature superconductivity in 1986 with the discovery of BaLaCuO systems, (see "Possible High $T_c$ Superconducting in the Ba-La-Cu-O System", Bednorz and Mueller, V. Phys. B-Condensed Matter No. 64, 189–193 (1986)), which was followed by the discovery of the YBCO materials, (see Wu et al, "Superconductivity at 93K in a New Mixed-Phase YBaCuO Compound System At Ambient Pressure", Physical Review Letters, Vol. 58, No. 9, pp 908–910 (1986)), followed by the discovery of the bismuth materials, (see Maeda et al, Japanese Journal of Applied Physics, Vol. 27, No. 2, pp L209–210 (1988) and Chu et al, "Superconductivity up to 114K in the BiAlCaSrCuO Compound System Without Rare-Earth Elements", Physical Review Letters, Vol. 60, No. 10, pp 941–943 (1988)) and the thallium based system such as TlCaBaCuO and TlBaCuO, see Sheng and Hermann Nature, 332: 55–58 (1988) and Sheng and Hermann, Nature 332: 138–139 (1988). Generally, these materials all include layered copper oxide planes. They will be referred to as a class as the "layered copper oxide" materials. Often times, these materials contain substitute substituent elements. The typical substrates of choice for the various layered copper oxide materials include: $LaAlO_3$, $MgO$, $SrTiO_3$, yttria stabilized zirconia and sapphire.

Considering high temperature superconductors further, various applications have been described for such devices, such as use in microwave systems, in multichip modules, for magnetic resonance imaging coils, as superconductive quantum interference devices (Squids), as infrared detectors and as junctions for logic. However, these devices have been limited in their theoretical performance by the non-superconducting properties of the other material, such as the substrates. For example, in the case of microwave devices, a substrate such as $SrTiO_3$ on which a superconducting line of YBCO or thallium has been formed may have substantial advantages over non-superconducting devices, the $SrTiO_3$ substrate still has a dielectric constant of 150 or greater. This adds to the overall electrical environment of the superconductor, causing suboptimal results. However, $SrTiO_3$ has proved to be a substrate of choice for layered copper oxide films as they have good lattice match to film such as YBCO, differing only by 1.2%, have good thermal stability, and have thermal expansion properties similar to various layered copper oxide materials. Thus, the choice of a substrate is once again dictated by growth requirements, even though the substrate may have suboptimal properties for intended applications.

In the field of semiconductors, it is a known desirable goal to form ferroelectrics and non-linear optical devices on semiconductors. In the case of ferroelectrics, non-volatile memories may be formed by forming the ferroelectric directly upon the semiconductor. For optical devices, it is desirable to connect devices such as fiberoptics to semiconductor devices. To date, efforts to form ferroelectrics such as $BaTiO_3$ on silicon have proved unsatisfactory, principally because of interdiffusion between the film and the substrate, because of differential thermal expansion, causing unacceptable film cracking.

Various attempts have been made to overcome the problem of substrates which are not optimally matched to use and commercialization of the films. In the semiconductor area, gallium arsenide ("GaAs") films have been grown with aluminum arsenide ("AlAs") as a sacraficial layer. Aluminum arsenide has a preferential etch rate of $10^8$ times larger than that of gallium arsenide. Hydrofluoric acid is used to etch away the sacraficial layer. However, the use of hydrofluoric acid is not desirable, given its hazardous properties. Further, gallium arsenide and aluminum arsenide are not compatible necessarily with oxide films, such as the layered copper oxides or the materials upon which they are to be formed.

An alternative solution which has been used both in the field of semiconductors and superconductors is that of buffer layers. Generally, a buffer layer is an intermediate layer disposed between the substrate and the desired film. Buffer layers are advantageous in that they tend to prevent interdiffusion between the substrate and the film and tend to grade the lattice mismatch, assuming the buffer layer is properly chosen. The disadvantages of use of a buffer layer include: thermal expansion problems, cost, dielectric problems associated with the substrate. Further, buffer layers tend to be very specific solutions to the combinations of substrate and film, thus not providing an acceptable general solution.

Despite the long-standing and vexing nature of this problem, no satisfactory solution has been proposed heretofore.

SUMMARY OF THE INVENTION

Novel structure and methods utilize layered copper oxide structures as a sacrificial release material. Generally, the method comprises the steps of forming a layered copper oxide etchable film on a growth substrate, growing a relatively inert oxide film on the layered copper oxide, and etching away the layered copper oxide to separate the film from the substrate. As an alternative, additional structures may be formed on the first relatively inert film. For example, if the first relatively inert oxide film is a material compatible with high temperature superconductivity, such as $SrTiO_3$ or $CeO2$, a further layered copper oxide film may be formed upon the film. Prior to etching of the layered copper oxide release layer, the high temperature superconductor structure is preferably protected from the etchant.

Generally, any of the layered copper oxide films may be utilized in conjunction with this technique. Specifically, YBCO and thallium based superconducting films may be utilized. Optionally, the film need not be superconducting. Preferably, the etch rate of the layered copper oxide material is substantially higher, preferably $10^8$ and more preferably $10^9 \times$ higher than that of the relatively inert film, though for short channels $10^5$ is adequate.

In the preferred embodiment, a YBCO superconducting layer is formed on a compatible substrate, such as $SrTiO_3$, MgO, LaAlO3, yttria stabilized zirconia or sapphire. Next, a relatively inert oxide film is formed. In the case of a ferroelectric, this might be a material such as BaTiO3, or in the case of a superconductor, LaAlO3, SrTiO3 or CeO2. If desired, additional structures may be formed on the relatively inert oxide. After the structure has been formed, the YBCO layer is etched in acid, preferably hydrochloric acid, most preferably in the range of 2:1 to 100:1 by volume hydrochloric acid, to achieve an etch rate of approximately 3 microns per minute.

Once the films have been formed on the layered copper oxide release material, the films may be removed from the growth substrate. The films may be attached to a desired substrate. For example, it may be desirable to attach a first oxide film of thin SrTiO3 having a second superconducting film of YBCO formed thereon onto a substrate having a low dielectric constant and low cost. In this way, the growth substrate may optionally be reused. Alternatively, the films may be formed into multi-layered stacks, preferably separated by organic dielectrics. In this way, various structures such as multi-chip modules may be fabricated. Low dielectric constant materials may be utilized to separate the various layers of superconducting material. Significantly, this method can result in structures in which an essentially single crystal film may be bonded to a substantially lower cost polycrystalline substrate, thereby dramatically reducing the cost of the overall structure.

Accordingly, it is a principal object of this invention to provide a method for forming oxide films of materials such as BaTiO3 or optical materials.

It is yet a further object of this invention to provide a method for formation of thin oxide materials which are compatible with the growth of high temperature superconductors.

It is yet a further object of this invention to provide a method for separation of an oxide film from a growth substrate.

It is yet a further object of this invention to provide an oxide film in combination with a substrate which is not optionally compatible with growth of the film.

It is yet a further object of this invention to provide multilayer structures of oxide films separated by a material, such as an organic dielectric.

BRIEF DESCRIPTION OF THE DRAWINGS

FIG. 2 shows a cross-section of a buffered substrate layer, a layered copper oxide release layer and an oxide film.

FIG. 3 shows a process flow including the optional step of a partial etch of the layered copper oxide release layer.

DETAILED DESCRIPTION

Figure 1A:
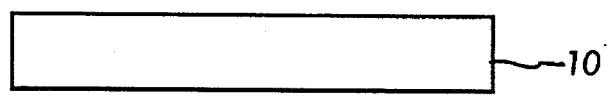
FIG. 1 shows a process flow for the method.
Figure 1B:
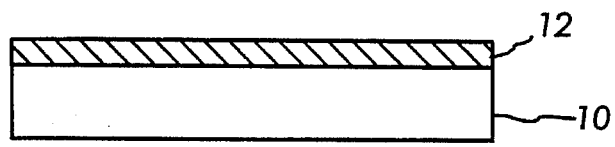
Figure 1C:
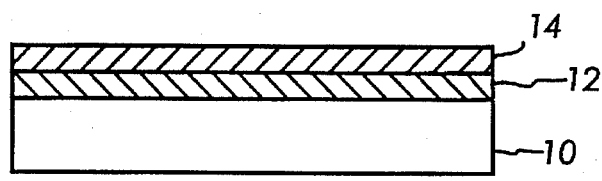
Figure 1D:
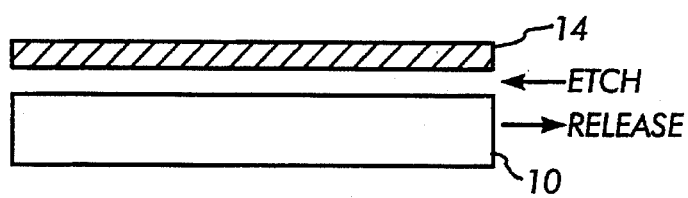
Figure 1E:
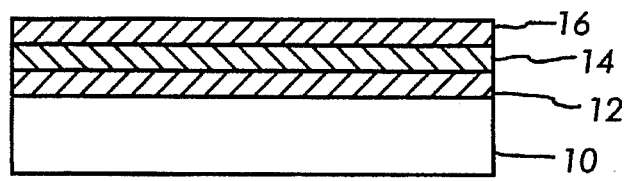
Figure 1F:
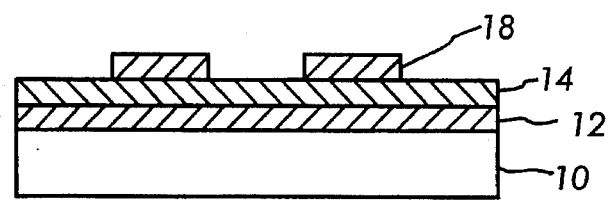
Figure 1G:
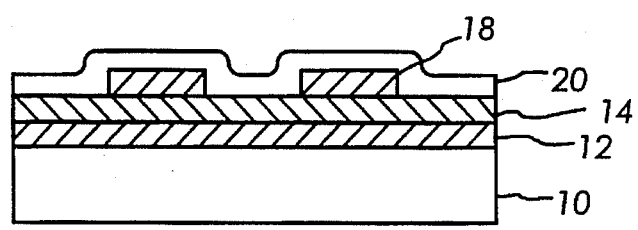
Figure 1H:
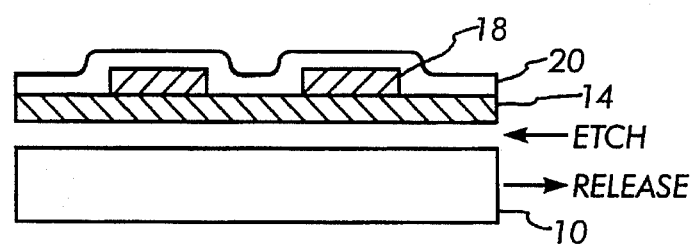

FIG. 1 shows a process flow for the overall method of manufacture. Step 1 shows a growth substrate 10 in cross-section. While the specifics of the growth substrate are described below, the substrate is generally chosen for optimal growth of a layered copper oxide film on the growth substrate 10. Step 2 shows a layered copper oxide material 12 disposed upon the growth substrate 10. Step 3 shows the formation of a first oxide layer 14 on the layered copper oxide material 12. In the preferred embodiment, the first oxide layer would be a ferroelectric, such a $BaTiO_3$, or an oxide compatible with further formation of high temperature superconducting materials, such as $LaAlO_3$, $SrAl5Ta5O3$, $NdGaO_3$, $NdAlO_3$, $BaTiO_3$, $CeO_2$ or $SrTiO_3$.

Step 4 assumes that a single oxide film 14 has been formed upon the layered copper oxide film 12. By etching the layered copper oxide film with a suitable acid, the first oxide film 14 may be separated from the growth substrate 10. The oxide film 14 may then be utilized in any desired manner, such as by placing the film 14 on a substrate (not shown) with properties more compatible with the use of the film 14, or alternatively, utilized in a multi-layered arrangement.

The prime steps in FIG. 1 show an alternative for further processing. Starting in step 4', the growth substrate 10 has a layered copper oxide material 12 disposed on it, followed by a first oxide film 14, and topped off by a second film 16. By way of example, the materials might comprise a growth substrate 10 of $SrTiO_3$, a YBCO layered copper oxide layer 12, a $SrTiO_3$ first oxide film 14 and a YBCO second film 16. In step 5', the second film 16 may be patterned and etched utilizing well known techniques. A patterned second film 18 results. If the patterned film 18 would undesirabily act with the etch for use on the layered copper oxide level 12, a passivation coating 20 should be formed to protect the second film 16 or patterned film 18.

In step 7', the combination of the first oxide film 14, patterned second film 18 and passivation material 20 is separated from the growth substrate 10 by etching of the layered copper oxide layer 12. Again, the growth substrate 10 may be reutilized for further crystal growth.

Optionally, a buffer layer may be utilized between the growth substrate 10 and the layered copper oxide material 12. As shown in FIG. 2, a growth substrate 10 has disposed in or on it a buffer layer 22. The total substrate 24 comprises the combination of the growth substrate 10 and the buffer layer 22. The buffer layer 22 may interface with the layered copper oxide material 26. The first oxide film may be formed upon the layered copper oxide material 26. Optionally, a buffer layer may be disposed between the first outside layer 28 and the layered copper oxide material 26.

FIG. 3 shows an alternative method of manufacture. A growth substrate 30 has formed upon it a layered copper oxide material 32. (See step 2). In step 3, a first oxide film 34 may be formed on the layered copper oxide material 32. A support substrate 36 is then combined with the first oxide film 34. Optionally, at this step, the layered copper oxide material is partially etched. In step 5, the etch is completed with the process substrate 36 and first oxide film 34 now being separated from the growth substrate 30. In step 6, an optional second film 38 may be formed on the first oxide film 34, which is now disposed on the support substrate 36. Any level of additional building or fabrication may be utilized on the device.

Turning to the various materials utilized in the process, with respect to growth substrates, it is generally desirable to choose the growth substrate for an optimal match to the layered copper oxide material and the ultimate film to be grown thereon. For example, the growth substrate should be chosen for good thermal stability, minimal lattice mismatch, minimal interdiffusion, and good thermal expansion match to the layered copper oxide and film materials. For high temperature superconductor, ferroelectric and non-linear optical applications, the general list of quality substrates include: $LaAlO_3$, MgO, $SrTiO_3$, yttria stabilized zirconia, $NdGaO_3$ and sapphire (though sapphire tends not to be good for relatively thick films).

Optionally, a buffer layer may be utilized on growth substrate. This generally is used to minimize interdiffusion between the buffer layer and the layered copper oxide material. Further, a buffer layer can provide for an intermediate crystal structure to provide for better crystal matching. An additional reason for utilizing a buffer layer is to reduce the etching of the growth substrate during the etch of the layered copper oxide material. By utilizing a buffer layer, the actual growth substrate crystal may be protected from the etchant. In this way, the growth substrate may be reused many times. This may substantially reduce the overall cost of producing composite films based on lesser expensive substrates.

Optionally, growth substrate may have etchant vias located through it. Generally, these vias would comprise holes which permit the etchant to pass through the growth substrate to etch the layered copper oxide material. In the preferred embodiment, the etch vias would be positioned where the crystal structure of the oxide film was not critical, such as where a connection would be made in a multi-chip module. Alternatively, as is known within the etching art, channels may be formed in photoresist to permit etching.

With regard to the etchable materials, generally any of the class of layered copper oxide materials may be utilized. Thus, that list currently includes the YBCO materials, the thallium based materials, the bismuth materials and the lanthanum materials. While this class of compounds has generally proved to form superconductors, it is not necessary that the material be a superconductor. For example, it would be possible to substitute a rare earth material for the yttrium in YBCO for purposes of this invention. Generally, the criteria is for a layered copper oxide material which has a relatively fast etch rate as compared to the oxide material formed on the layered copper oxide. Typically, a thickness of 50 Å to 0.5 microns is desirable. A layered copper oxide film on the thinner end of the spectrum tends to result in better ultimate oxide films.

The first oxide layer may be formed of any material which is compatible with the layered copper oxide material, or intermediate buffer layer, and which has a relatively low rate of etch compared to the layered copper oxide material. For example, $SrTiO_3$ or $CeO_2$ are oxides which are compatible with growth on YBCO and have relatively low etch rates in HCL and nitric acid. Generally, the first oxide film should be thick enough to avoid pin holes and cracks. This is generally a matter determined by the deposition method of the first oxide film. For example, laser ablation deposition techniques tend to result in pin hole or crack defects because of relatively large chunks of materials ablated from the target. If pin holes and other cracks are not avoided, the possibility exists for the etchant to attack the sec nd film during the etching of the layered copper oxide material.

The first oxide film may then have any amount of material placed upon it. In the preferred embodiment, if the first oxide film is a oxide compatible with the growth of further high temperature superconducting material, such as $SrTiO_3$ or $CeO_2$, a superconducting material may be deposited thereon. Once the superconductor is deposited, it may be optionally patterned, utilizing conventional techniques, such as photolithography. In the preferred embodiment, the etched superconductor is then passivated or otherwise protected prior to etching of the layered copper oxide material. In the preferred embodiment, amorphous SrTiO3 is laser ablated onto the patterned superconductor and exposed first oxide film. The layered copper oxide material is then etched, with the patterned superconductor being protected by the passivation coating. Perferably, an organic passivation coating, such as a polyimide, may be used.

If necessary, a separate structure may be used to support the films or materials grown upon the layered copper oxide material. A black wax like material by the trade name APIEZON-W, from Apiezon Company may be utilized. Alternatively, an organic glue may be utilized to affix the oxide film to a process substrate.

The potential applications for the delaminated films are numerous. In the microwave electronics area, historically the substrate which was optimal for growth of the oxide film was suboptimal from an engineering use standpoint. Specifically, the substrates tended to have a relatively high dielectric constant, were relatively costly and suffered from the crystalline twinning problem. With the separation of an oxide film made preferable growth substrate, the film may be affixed to an optimal substrate, such as quartz or polycrystalline alumina. The substrate may be chosen for beneficially low dielectric constant, relatively low cost and absence of twinning. Further, the high power performance of such devices can be improved by combining the oxide giving the best power performance and substrate with the best dielectric constant.

In yet other applications, the size of the substrate has been a limitation. For example, in medical imaging applications, the size and cost of the substrate have been key concerns. With this technique, the cost and size of the substrate are no longer limiting factors. Formation of interconnects, such as in multi-chip modules, typically require a substantially flat substrate. Utilizing the disclosed techniques, a substantially flat, and beneficially low cost, substrate may be chosen. Further, the interlayer dielectric which has previously been of a high dielectric constant may be lowered to the lowest possible value. Further, the thickness of the dielectric can now be varied from 0.5 microns to 100 microns.

Yet another application for this technique is to infrared detection, or bolometric devices. The substrate has previously contributed to the relatively large thermal mass of the device by separating the oxide film from the substrate, the lowest possible thermal mass is achieved since no substrate is used.

Although the invention has been described with respect to specific preferred embodiments, many variations and modifications may become apparent to those skilled in the art. It is therefore the intention that the appended claims be interpreted as broadly as possible in view of the prior art to include all such variations and modifications.

I claim:

1. A method for forming oxide films comprising the steps of:
   (a) forming a layered copper oxide release material on a growth substrate wherein the layered copper oxide release material is chosen from the following group: the YBaCuO, the TlCaBaCuO, the LaSrCuO, and the BiSrCaCuOx families of superconductors,
   (b) forming a first oxide film on the release material,
   (c) etching away the release material to separate said first oxide film from the growth substrate, and
   (d) attaching said first oxide film to a planar support member.

2. The method for forming oxide films of claim 1 wherein the planar support member comprises a second substrate.

3. The method of claim 1 wherein a second oxide is formed on the first oxide film.

4. The method claim 3 wherein the oxide film is separated from the second oxide film by a dielectric.

5. The method of claim 4 wherein the dielectric is an organic dielectric.

6. The method of claim 4 wherein the dielectric has a thickness from 0.5 microns to 100 microns.

7. The method of claim 2 wherein the second substrate is a support substrate.

8. The method of claim 7 wherein the support substrate is attached to the first oxide layer prior to the etch of step c.

9. The method of claim 8 wherein the support substrate is attached to the oxide with a wax.

10. The method of claim 9 wherein the wax is selected from the group consisting of: organic glues or Apiezon.

11. The method for forming oxide films of claim 1 wherein after the growth substrate is released from the oxide film, the growth substrate is reused for formation of another oxide film.

12. The method of claim 1 wherein the layered copper oxide is a high temperature superconductor.

13. The method of claim 1 wherein the release material is from 50 Å to 0.5 microns thick.

14. The method of claim 1 where the growth substrate includes a buffer layer disposed adjacent the layered copper oxide release material.

15. The method of claims 2 or 3 wherein the layered copper oxide is YBaCuO.

16. The method of claim 1 wherein the oxide film is a ferroelectric.

17. The method of claim 1 wherein the oxide film is an optical material.

18. The method of claim 17 wherein the optical material is a non-linear optical material.

19. The method of claim 1 where the oxide film is compatible with high temperature superconductor.

20. The method of claim 19 further including the step of forming a high temperature superconducting structure on the oxide layer.

21. The method of claim 20 further including the step of patterning and etching the high temperature superconductor on the oxide layer.

22. The method of claim 1 wherein the oxide film is chosen from the group of $SrTiO_3$, $SrAl_{0.5}Ta_{0.5}O_3$, $LaAlO_3$, $BaTiO_3$, $NdGaO_3$, $NdAlO_3$ or $CeO_2$.

23. The method of claim 1 wherein the etching uses acid chosen from the following group: hydrochloric acid, phosphoric acid and nitric acid.

24. The method of claim 23 wherein the hydrochloric acid etch is in the range from 2:1 to 100:1 by volume.

25. The method of claim 1 wherein the etch rate of the release layer is at least $10^5$ times greater than the etch rate for the oxide layer.

26. The method of claim 1 wherein the etching occurs partially through vias in the growth substrate.

27. A method for forming oxide films comprising the steps of:
   (a) forming a layered copper oxide release material made of YBaCuO on a growth substrate.
   (b) forming a first oxide film on the release material,
   (c) etching away the release material to separate said first oxide film from the growth substrate, and
   (d) attaching said first oxide film to a planar support member.

* * * * *